United States Patent [19]

Kagawa

[11] Patent Number: 5,371,405
[45] Date of Patent: Dec. 6, 1994

[54] HIGH-FREQUENCY HIGH-POWER TRANSISTOR

[75] Inventor: Kazuhisa Kagawa, Itami, Japan

[73] Assignee: Mitsubishi Denki Kabushiki Kaisha, Tokyo, Japan

[21] Appl. No.: 12,521

[22] Filed: Feb. 2, 1993

[30] Foreign Application Priority Data

Feb. 4, 1992 [JP] Japan .................................. 4-019114

[51] Int. Cl.$^5$ ...................... H01L 23/48; H01L 29/40; H01L 29/80; H01L 29/72

[52] U.S. Cl. ........................ 257/664; 257/259; 257/532; 257/584; 257/666; 257/724; 257/725; 257/728

[58] Field of Search ............... 257/666, 664, 584, 532, 257/728, 259, 256, 724, 725

[56] References Cited

U.S. PATENT DOCUMENTS

| 3,713,006 | 1/1973 | Litty et al. | 317/101 A |
|---|---|---|---|
| 3,893,159 | 7/1975 | Martin | 257/666 |
| 3,936,864 | 2/1976 | Benjamin | 257/678 |
| 3,969,752 | 7/1976 | Martin et al. | 357/51 |
| 3,996,603 | 12/1976 | Smith | 257/701 |
| 4,042,952 | 8/1977 | Kraybill | 357/68 |
| 4,107,728 | 8/1978 | Max | 357/80 |
| 4,200,880 | 4/1980 | Frey | 357/51 |
| 4,393,392 | 7/1983 | Hale | 257/678 |
| 4,456,888 | 6/1984 | Ayasli | 330/277 |
| 4,783,697 | 11/1988 | Benenati et al. | 257/701 |
| 4,843,440 | 6/1989 | Huang | 357/22 |

FOREIGN PATENT DOCUMENTS 1574497 9/1980 United Kingdom .

Primary Examiner—William D. Larkins
Assistant Examiner—Teresa M. Arroyo
Attorney, Agent, or Firm—Leydig, Voit & Mayer

[57] ABSTRACT

An improved high-frequency high-power transistor includes a transistor chip and capacitors forming an RF shunting internal matching circuit. The capacitors are connected with RF shunting wires to a collector pad to which the transistor chip is die-bonded. The wires have the same lengths and are disposed symmetrically relative to input and output leads of transistor cells within said transistor chip so that they uniformly influence the transistor cells.

17 Claims, 3 Drawing Sheets

HIGH-FREQUENCY HIGH-POWER TRANSISTOR

The present invention relates to a high-frequency high-power transistor, and, more particularly, to a high-frequency high-power transistor including a plurality of relatively large transistor cells.

BACKGROUND OF THE INVENTION

Recently, in common communication systems, satellite communication systems, and television systems, demands for high-frequency high-power transistors have increased. Generally, in order to provide high-frequency transistors which can provide high output power, a structure including a plurality of transistor cells in a single transistor chip or in a transistor package is used. A transistor with such a structure, however, will have small input and output impedances, which makes it difficult to provide good impedance matching with respect to external circuits. When such a transistor is connected to external circuits with poor impedance matching, undesirable power loss is caused at input and output sections of the transistor, which degrades operating efficiency. Accordingly, such situations must be avoided.

A technique to avoid the above-stated problem in high-frequency high-power transistors is to provide an MOS capacitor, for example, in a transistor package. An LC circuit includes the capacitance provided by the MOS capacitor and the inductance provided by bonding wires connected to input and output electrodes of the transistor. The LC circuit constitutes an internal matching circuit to provide impedance conversion for proper impedance matching with external circuits.

Further analysis, however, has shown that because bonding wires connecting an output electrode, e.g. collector electrode, of each transistor to various portions of that transistor (i.e. a portion closer to the MOS capacitor, a portion remote from the capacitor, and an intermediate portion between them) act differently, operating characteristics of those portions are non-uniform and, accordingly, improvements in efficiency or output power of the transistor are not achieved as desired.

Accordingly, an object of the present invention is to provide an improved high-frequency high-power transistor having an internal matching circuit therein.

Specifically, an object of the present invention is to provide an internal matching circuit which acts uniformly on various portions contributing to the transistor function on a transistor chip, so that the operating efficiency of the transistor is increased to thereby provide high output power.

Another object of the present invention is to make as uniform as possible the effects of the inductance of the bonding wires of an internal matching circuit, and characteristics of various portions contributing to the transistor functions on a transistor chip, whereby the operating characteristics of the respective transistor portions become uniform and the output efficiency of the transistor is improved.

Still another object of the present invention is to make as uniform as possible the lengths of the bonding wires of the output side internal matching circuit with respect to the various portions exhibiting transistor functions on the transistor chip so that the operating characteristics of the respective transistor portions become uniform to improve the output efficiency of the transistor.

The above-described objects and other objects as well as advantages of the present invention will be clear from the following description made with reference to the accompanying drawings.

DETAILED DESCRIPTION

Figure 1A:
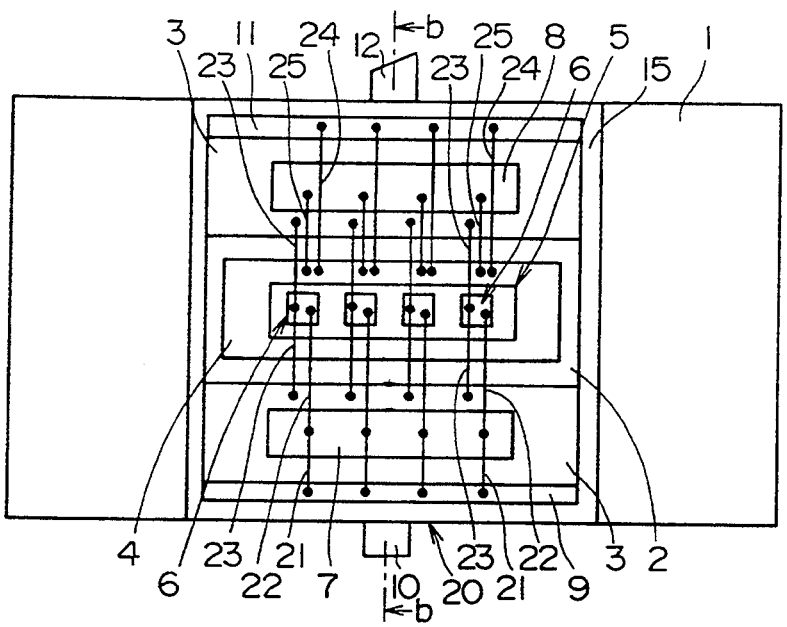
FIG. 1(a) is a plan view of an example of a conventional high-frequency high-power packaged transistor with a cap removed.
Figure 1B:
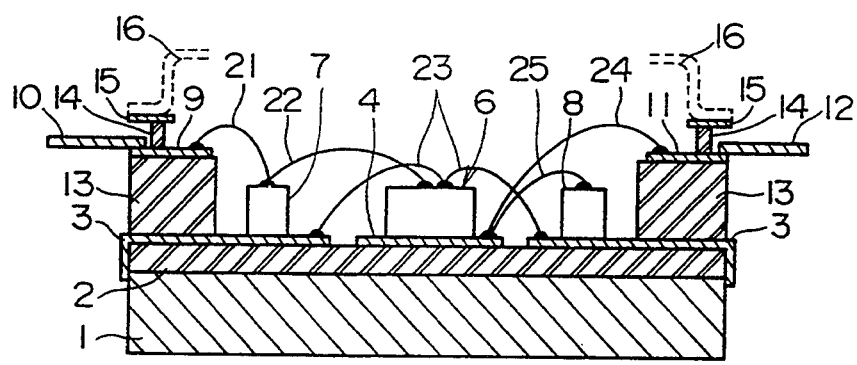
FIG. 1(b) is a cross-sectional view along a line b—b in FIG. 1(a)

FIGS. 1(a) and 1(b) are plan and cross-sectional views, respectively, of a conventional high-frequency high-power transistor including a plurality of transistor cells. In FIGS. 1(a) and (b), the transistor is shown with a cap removed. FIG. 1(b) is a cross-sectional view along a line b—b in FIG. 1(a), but, for better understanding, components are shown partially enlarged and in a different scale from that of FIG. 1(a). The transistor shown in FIGS. 1(a) and 1(b) includes a heat sink 1 of a metal, such as a Cu—W alloy, a ceramic substrate 2 having good thermal conductivity, such as BeO, secured to the upper surface of the heat sink 1, and two ground pads 3 and a collector pad 4, spaced from each of the ground pads 3, on the ceramic substrate 2. The components 1, 2, 3, and 4 are parts of a base member. The pads 3 and 4 are metallization layers comprising a stack of, for example, Mo—Mn, Ni and Al, but any other known metallization layer may be used instead.

Around the periphery of the base member, partitions 13 and 14 of ceramic, such as $Al_2O_3$, and a frame 15 of a metal, such as Kovar (trade name), which are stacked in the named order, are disposed. The partitions 13 and 14 and the frame 15 form an outer wall of a transistor package 20. A cap 16 of, for example, Kovar closes the structure. The heat sink 1, the ceramic substrate 2, the ceramic partitions 13 and 14, the metal frame 15, and the cap 16 form the package 20.

Within the boundaries defined by the ceramic partitions 13, major portions of a transistor are disposed. Specifically, capacitors 7 and 8 are disposed on respective ones of the two ground pads 3. Any type of capacitors including MOS capacitors can be used as the capacitors 7 and 8, but, for convenience of explanation, they are described as being MOS capacitors in this specification. Each of the MOS capacitors 7 and 8 has a well-known structure comprising a silicon body having a metal electrode on one side thereof, and a stack of a silicon oxide layer and a metal electrode covering the silicon oxide layer, on the other side. A transistor chip 5 is secured by die bonding to the collector pad 4. The transistor chip 5 includes a plurality (four in the illustrated example) of juxtaposed transistor cells 6.

On the top end surfaces of those portions of the ceramic partitions 13 which face each other, a metallization layer forming an input side internal lead 9 and a metallization layer forming an output side internal lead 11 are disposed, respectively. The input side internal lead 9 is connected to an input lead 10 for receiving high frequency power, while the output side internal lead 11 is connected to an output lead 12 for feeding out amplified high frequency power.

The transistor cells 6 in the illustrated example are to be operated in parallel in a grounded-base configuration. Each cell 6 has its emitter electrode connected by a wire 22 to one electrode of the MOS capacitor 7 which, in turn, is connected by a wire 21 to the input side internal lead 9. Thus the capacitor 7 is connected between the emitter of each transistor cell 6 and one of the ground pads 3. Each cell 6 has its base electrode connected by wires 23 to the ground pads 3. The collector pad 4 is connected at a plurality of points close to the respective transistor cells 6 to the output side internal lead 11 by means of wires 24. Similarly, the collector pad 4 is connected at a plurality of points thereof closer to the output side internal lead 11 than the respective transistor cells 6 are, to the electrode of the MOS capacitor 8 at a plurality of points thereof by means of RF shunting wires 25.

In the above-described configuration, the MOS capacitors 7 and 8 form a lowpass-type input side internal matching circuit and an RF shunting type output side internal matching circuit, respectively, for realizing appropriate impedance matching with respect to external circuits.

The operating characteristics of the input and output sides of the respective transistor cells 6 of the conventional high-frequency high-power transistor of the above-described structure are different, which causes degradation in the performance of the transistor.

Figure 1C:
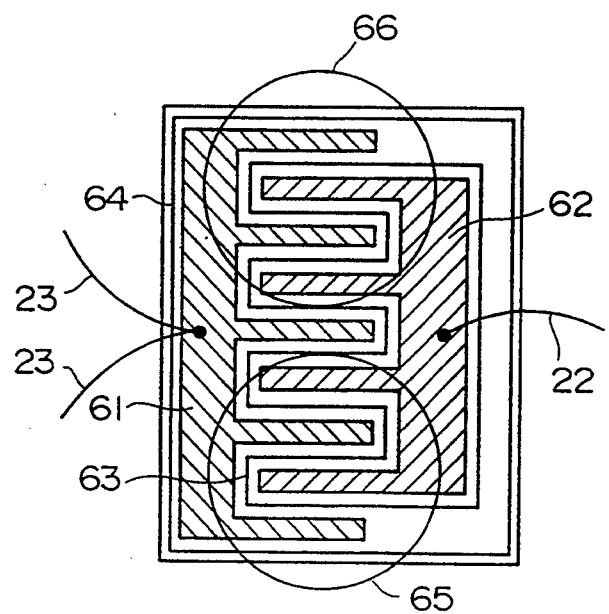
FIG. 1(c) is a plan view of one of transistor cells of the transistor of FIGS. 1(a) and 1(b)

More particularly, the current density of a high-frequency high-power transistor is large so that a so-called edge effect becomes significant and most of the current is concentrated in peripheral portions of the emitter. In order to improve performance, the ratio of the total length of the periphery of the emitter to the collector area should be increased. For example, as shown in FIG. 1(c), a base region and an emitter region may be shaped to provide a comb-shaped emitter junction 63. The base electrode 61 and the emitter electrode 62 shown in FIG. 1(c) are comb-shaped and interdigitated with each other. Reference numeral 64 denotes the collector junction.

Several shapes of electrodes other than the comb-shape may be used for the purpose of improving the performance of transistors, but they have a common disadvantage that operating characteristics of their input and output sides are different from each other, which degrades their performance. Accordingly, the present invention and conventional techniques are described in terms of such a comb-shaped electrode configuration.

The RF shunting wires 25 connecting the MOS capacitor 8 are connected to the collector pad 4 at points near the output side portion 66 shown in FIG. 1(c) (i.e. the portion closer to the output side internal lead 11 than to the input side internal lead 9) of each cell 6, and, therefore, the output capacitance in the output side portion 66 of the transistor cell is canceled by the inductance provided by the RF shunting wire 25, but the input capacitance in the input side portion 65 (i.e. the portion closer to the input side internal lead 9) cannot be efficiently canceled. Then, within the same transistor cell 6, different characteristics are exhibited in the portions 65 and 66 and, therefore, transistor operation cannot be uniform over the entire transistor.

The present invention has been made to eliminate the above-described disadvantages of conventional high-frequency high power transistors. According to the present invention, the lengths of the RF shunting wires 25 are made effectively equal for various portions of each transistor cell.

The present invention is now described with reference to the drawings. It should be noted that although each of the embodiments of the invention is shown in a transistor package and illustrated in a plan view similar to FIG. 1(a), with its cap removed, the structure of the package and the structure of each transistor cell are similar to those shown in FIGS. 1(b) and 1(c). It should be further noted that the same reference numerals throughout the drawings denote the same or equivalent portions or components.

Embodiment 1

Figure 2:
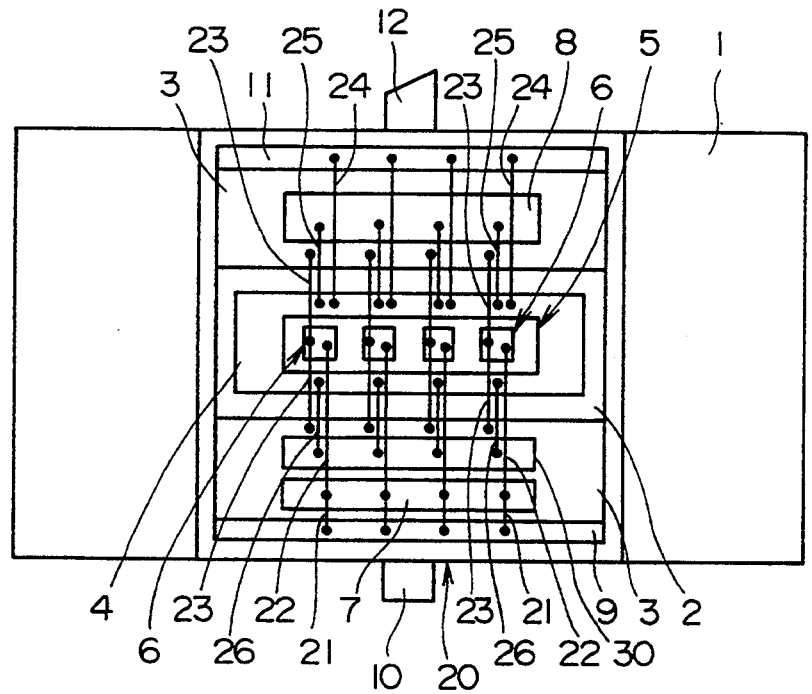
FIG. 2 is a plan view of a packaged high-frequency high-power transistor with a cap removed according to one embodiment of the present invention.

FIG. 2 shows a high-frequency high power transistor according to a first embodiment of the present invention. In this embodiment, in addition to the RF shunting MOS capacitor 8 disposed between the transistor chip 5 and the output side internal lead 11, an additional RF shunt MOS capacitor 30 is disposed between the transistor chip 5 and the input side internal lead 9. RF shunting wires 25 and 26 connect the collector pad 4 to the MOS capacitors 8 and 30, respectively. The wires 25 and 26 have equal lengths and are symmetrical (in the vertical direction in the drawing) relative to the transistor cells 6 interposed therebetween. With this arrangement, the output capacitances in the output and input sides of the respective transistors 6 are substantially canceled, which necessarily leads to uniform cancellation of the output capacitance throughout the portions of the transistor cells 6. Thus, the various portions in the cell 6 as a whole exhibit substantially the same characteristic so that a uniform operating characteristic of the transistor is realized.

Embodiment 2

Figure 3:
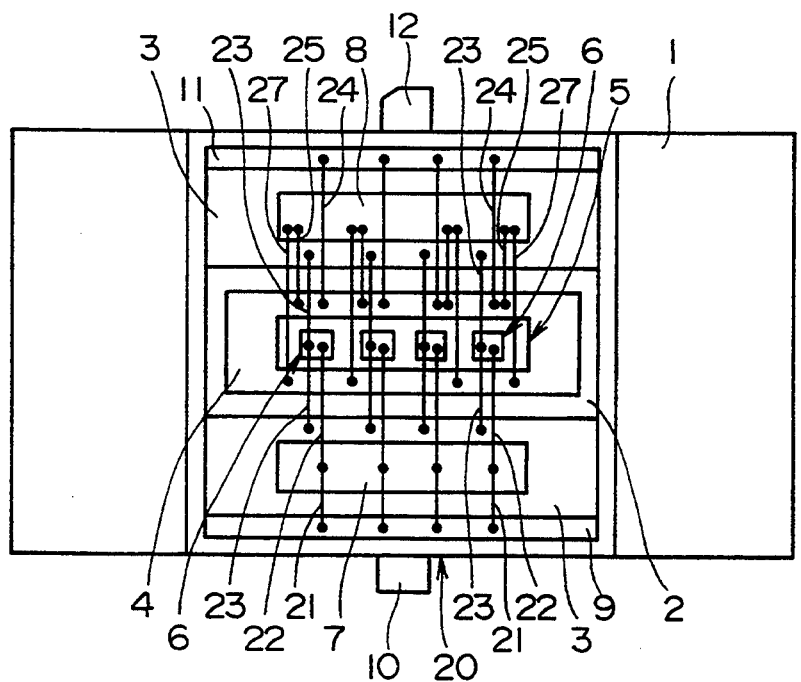
FIG. 3 is a plan view of a packaged high-frequency high-power transistor with a cap removed according to a second embodiment of the present invention.

FIG. 3 shows a high-frequency high-power transistor according to a second embodiment of the present invention. Different from the embodiment shown in FIG. 2, the transistor according to the embodiment shown in FIG. 3 includes only one RF shunting MOS capacitor 8 disposed between the transistor chip 5 and the output side internal lead 11. The MOS capacitor 8 and the collector pad 4 are interconnected by means of two RF shunting wires 25 and 27 for each transistor cell 6, as shown. The wire 25 connects a point on the collector pad 4 on the output internal lead side of each transistor cell 6 to the MOS capacitor 8, and the wire 27 connects a point on the collector pad 4 closer to the input side internal lead 9 relative to each transistor cell 6 to the MOS capacitor 8. It should be noted that although the wires 25 and 27 are shown as if they were straight and had different lengths, the wires 25 are in fact slack so as to have substantially the same length as the wires 27. This arrangement provides substantially the same effect as obtained by the first embodiment shown in FIG. 2.

Embodiment 3

Figure 4:
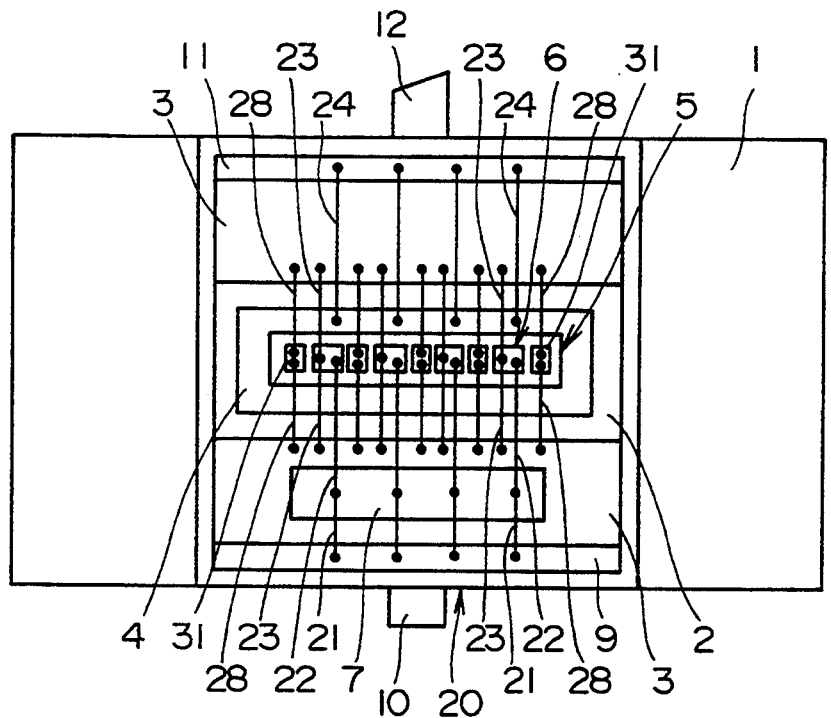
FIG. 4 is a plan view of a packaged high-frequency high-power transistor with a cap removed according to a third embodiment of the present invention.

A high-frequency high-power transistor according to a third embodiment of the present invention is shown in FIG. 4. According to this embodiment, the transistor cells 6 and RF shunting MOS capacitors 31 are disposed along a common straight line alternating with each other in the transistor chip 5.

As the RF shunting capacitors are disposed in the transistor chip, they are preferably MOS capacitors, for easier and simpler fabrication of the device.

The respective MOS capacitors 31 are connected by RF shunting wires 28 to the respective input and output side ground pads 3. The lengths of the wires 28 connecting each MOS capacitor 31 to the respective ground pads 3 are substantially equal.

With this arrangement, the RF shunting wires 28 give the same effect not only to the various portions of each transistor cell 6 but also to all of the transistor cells 6. Thus, substantially the same characteristic is exhibited by the various cell portions, whereby a uniform operating characteristic is realized.

Embodiment 4

Figure 5:
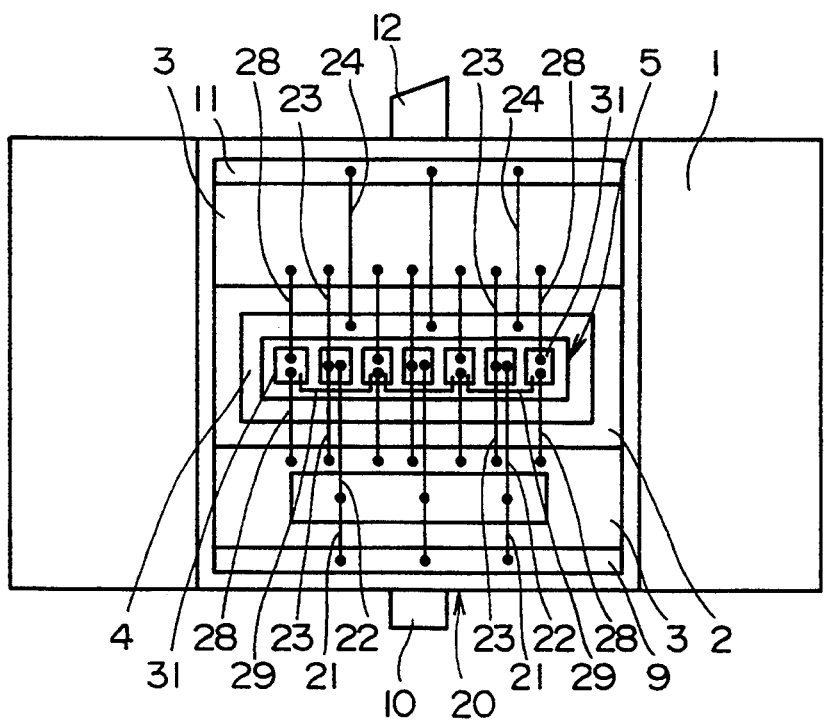
FIG. 5 is a plan view of a packaged high-frequency high-power transistor with a cap removed according to a fourth embodiment of the present invention.

FIG. 5 shows a high-frequency high-power transistor according to a fourth embodiment of the present invention. The structure of the transistor of FIG. 5 is basically the same as that of the third embodiment shown in FIG. 4. The difference is that one electrode of each RF shunting MOS capacitor 31 is connected on the transistor chip 5 by a wire 29 to the corresponding electrode of the next closet capacitor 31 with a transistor cell 6 interposed therebetween. The length of the wires 29 is equal to one half the wavelength λ of a high frequency signal to be handled. By connecting the respective MOS capacitors 31 with the wires 29, there is no potential difference among the electrodes of the MOS capacitors 31, i.e. the capacitor electrodes are at the same potential. This uniform potential results in stable transistor operation. The effect of the RF shunting wires 28 is the same as in the third embodiment.

As described in detail in the above, according to the present invention, RF shunting wires are arranged to act uniformly on various portions of respective transistor cells, which provides uniform operation not only within each cell but also among the transistor cells. Thus, improved characteristics are provided for high-frequency high-power transistors.

It should be noted that the illustrated structures of the transistors are not restrictive, but various modifications may be made within the scope of the invention as described in the claims, by using conventional semiconductor techniques. For example, the number of transistor cells can be from one to any number which is structurally allowable depending on the purpose of the transistor. Further, any well-known capacitors other than MOS type capacitors, such as capacitors which can be fabricated by thick-film or thin-film techniques, may be used as the RF shunting capacitors. In addition to silicon, compound semiconductor materials may be used for forming transistors, and materials other than the ones used in the illustrated embodiments may be used as materials of the insulating substrate, metallization layers, bonding wires, etc.

What is claimed is:

1. A high-frequency high-power transistor comprising:
   a package including an input terminal, an output terminal, and a ground terminal;
   a transistor chip including at least one transistor cell disposed within said package, each transistor cell having an input side electrically connected to said input terminal for receiving an input signal, an output side electrically connected to said output terminal for supplying an output signal, and a grounded side electrically connected to said ground terminal;
   an input capacitor and an output capacitor disposed within said package on opposite sides of said transistor chip; and
   a wire interconnecting said output side of said at least one transistor cell to said output capacitor and a wire interconnecting said output side of said at least one transistor cell to said input capacitor wherein said wires are symmetrically disposed relative to said transistor chip and have substantially the same lengths.

2. A high-frequency high-power transistor according to claim 1 including a collector pad within said package wherein said transistor chip is bonded to said collector pad disposed within said package.

3. A high-frequency high-power transistor comprising:
   a package including an input terminal, an output terminal, and a ground terminal;
   a transistor chip including at least one transistor cell disposed within said package, each transistor cell having an input side electrically connected to said input terminal for receiving an input signal, an output side electrically connected to said output terminal for supplying an output signal, a grounded side electrically connected to said ground terminal, and opposed first and second sides;
   an input capacitor and an output capacitor disposed within said package between said transistor chip and said input terminal and between said transistor chip and said output terminal, respectively, the first side of said at least one transistor cell facing said input capacitor and the second side of said at least one transistor cell facing said output capacitor; and
   first and second wires interconnecting said output side of said at least one transistor cell to said output capacitor from a location adjacent the first side of said at least one transistor cell and from a location adjacent the second side of said at least one transistor cell, respectively, said first and second wires having substantially the same lengths.

4. A high-frequency high-power transistor according to claim 3 including a collector pad within said package wherein said transistor chip includes a plurality of transistor cells and is bonded to said collector pad disposed within said package.

5. A high-frequency high-power transistor comprising:
   a package including an input terminal, an output terminal, and a ground terminal;
   a transistor chip disposed within said package, said transistor chip including a plurality of transistor cells and a plurality of RF shunting capacitors, said transistor cells and capacitors being disposed along a strident line, alternating with each other;
   two ground pads disposed within said package and electrically connected to said ground terminal; and
   wires interconnecting each of said capacitors to each of said ground pads, said wires connecting said capacitors to said ground pads having substantially the same length.

6. A high-frequency high-power transistor according to claim 5 including a plurality of conductors wherein each of said capacitors includes an electrode connected by one of said conductors to the corresponding electrode of the closest capacitor with one transistor cell interposed therebetween so that said electrodes of said capacitors are at the same potential.

7. A high-frequency high-power transistor according to claim 6 wherein the length of each of said conductors is one half wavelength at an operating frequency of said transistor.

8. A high-frequency high-power transistor according to claim 1 wherein said input and output capacitors are MOS capacitors.

9. A high-frequency high-power transistor according to claim 3 wherein said input and output capacitors are MOS capacitors.

10. A high-frequency high-power transistor according to claim 5 wherein said RF shunting capacitors are MOS capacitors.

11. A high-frequency high-power transistor according to claim 1 including a third capacitor adjacent said input capacitor.

12. A high-frequency high power transistor according to claim 11 including a wire interconnecting said input terminal to said third capacitor and to said input side of said at least one transistor cell and a wire interconnecting said output terminal to said output side of said at least one transistor cell.

13. A high-frequency high power transistor according to claim 1 including two ground pads disposed within the package on opposite sides of said transistor chip and a wire connecting the grounded side of said at least one transistor cell to both of said ground pads.

14. A high-frequency high power transistor according to claim 3 including a wire interconnecting said input terminal to said input capacitor and to said input side of said at least one transistor cell and a wire interconnecting said output terminal to said output side of said at least one transistor cell.

15. A high-frequency high power transistor according to claim 3 including two ground pads disposed within the package on opposite sides of said transistor chip and a wire connecting the grounded side of said at least one transistor cell to both of said ground pads.

16. A high-frequency high power transistor according to claim 5 including a wire interconnecting said input terminal to said input capacitor and to said input side of a corresponding transistor cell and a wire interconnecting said output terminal to said output side of the corresponding transistor cell.

17. A high-frequency high power transistor according to claim 5 wherein said two ground pads are disposed on opposite sides of said transistor chip and including a respective wire connecting said grounded side of said transistor cells to both of said ground pads.

* * * * *

UNITED STATES PATENT AND TRADEMARK OFFICE
CERTIFICATE OF CORRECTION

PATENT NO. : 5,371,405
DATED : December 6, 1994
INVENTOR(S) : Kagawa

It is certified that error appears in the above-indentified patent and that said Letters Patent is hereby corrected as shown below:

Column 6, Line 64, change "strident" to --straight--.

Signed and Sealed this

Ninth Day of May, 1995

Attest:

BRUCE LEHMAN

*Attesting Officer*     *Commissioner of Patents and Trademarks*